United States Patent
Chen et al.

(10) Patent No.: US 11,772,962 B1
(45) Date of Patent: Oct. 3, 2023

(54) MEMS PACKAGE AND FORMING METHOD THEREOF

(71) Applicant: TAIWAN SEMICONDUCTOR MANUFACTURING COMPANY LTD., Hsinchu (TW)

(72) Inventors: Chung-Nang Chen, Hsinchu County (TW); Shing-Huang Wu, Hsinchu (TW); Chia-Wei Liu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/817,367

(22) Filed: Aug. 4, 2022

(51) Int. Cl.
*B81B 7/00* (2006.01)
*B81C 1/00* (2006.01)

(52) U.S. Cl.
CPC ........ *B81B 7/0058* (2013.01); *B81C 1/00333* (2013.01); *B81B 2207/07* (2013.01)

(58) Field of Classification Search
None
See application file for complete search history.

(56) References Cited

U.S. PATENT DOCUMENTS

| | | | | |
|---|---|---|---|---|
| 2008/0242123 | A1* | 10/2008 | Martinson | H01R 13/2442 439/70 |
| 2021/0354979 | A1* | 11/2021 | Ba-Tis | B81B 3/0081 |

FOREIGN PATENT DOCUMENTS

| | | | | |
|---|---|---|---|---|
| CN | 112424574 A | * | 2/2021 | ........... B81B 3/0056 |
| DE | 102011085348 A1 | * | 5/2012 | ....... H01L 23/49816 |
| WO | WO-2017009850 A1 | * | 1/2017 | ........... B81B 3/0056 |
| WO | WO-2019097895 A1 | * | 5/2019 | ......... G02B 27/0172 |

* cited by examiner

*Primary Examiner* — Michael Lebentritt
(74) *Attorney, Agent, or Firm* — WPAT LAW; Anthony King

(57) ABSTRACT

A MEMS package and a method for forming a MEMS package are provided. The MEMS package includes a package substrate, a housing structure, an image sensor structure, a MEMS structure and a composite damper. The housing structure includes a stopper. The image sensor structure and the MEMS structure are between the package substrate and the housing structure. An interconnect wire electrically connects the MEMS structure to the image sensor structure. The composite damper is between the package substrate and the housing structure. The composite damper is configured to control a gap between the interconnect wire and the stopper.

20 Claims, 15 Drawing Sheets

MEMS PACKAGE AND FORMING METHOD THEREOF

BACKGROUND

The semiconductor industry has experienced rapid growth and demands for highly integrated semiconductor devices are increasing. Microelectromechanical systems (MEMS) devices, such as motion sensors, pressure sensors, microphones, accelerometers and gyroscopes, have found use in many electronic devices. In particular, motion sensors, accelerometers and microphones are commonly used in tablet computers, laptop computers and smartphones. However, steps taken to meet these demands have increased the complexity of processing and manufacturing semiconductor devices for integrated circuits (ICs) and, for these demands to be met, similar developments in IC processing and manufacturing are needed.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
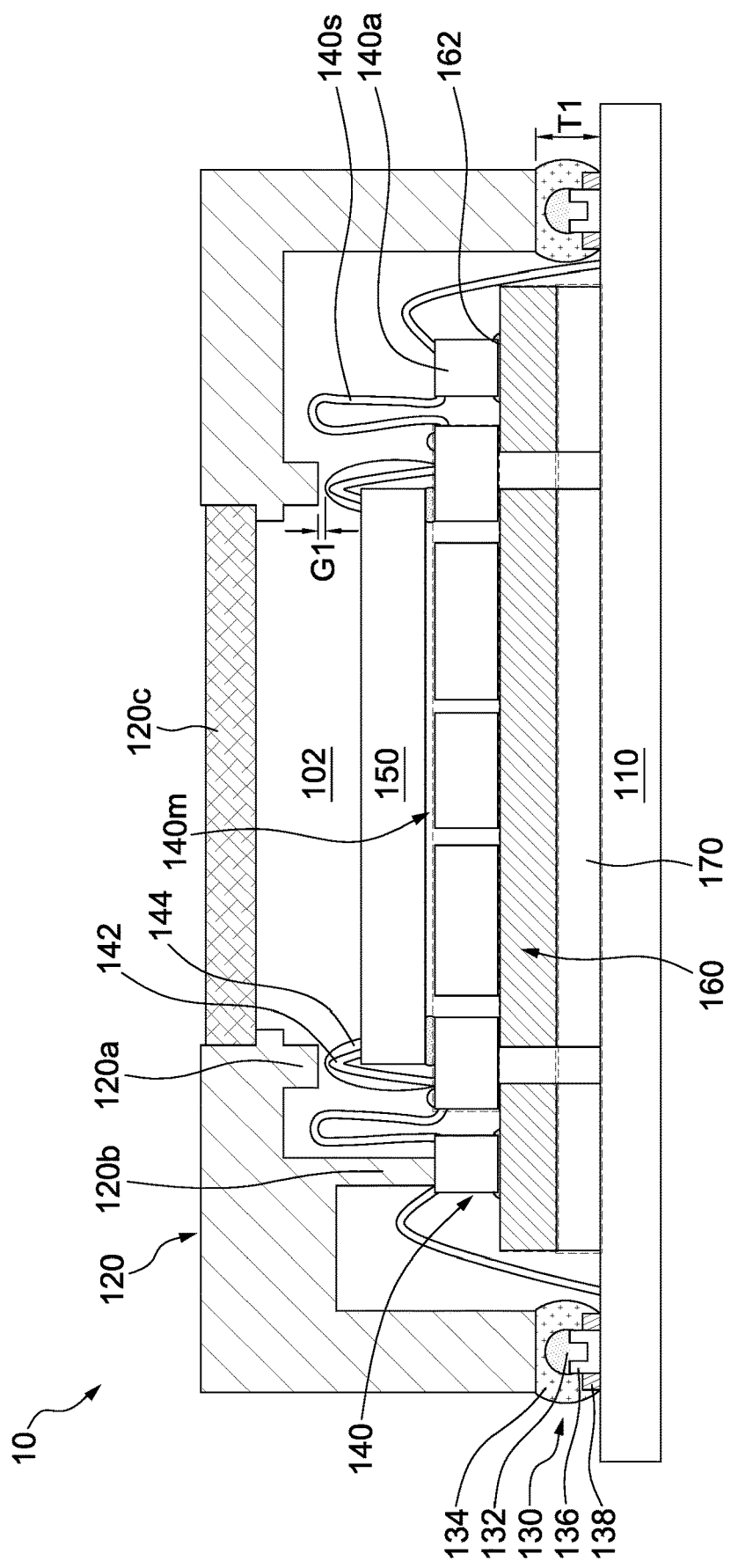
FIG. 1 is a cross-sectional view of a MEMS package according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A microelectromechanical systems (MEMS) package may comprise a base structure, a housing structure, and a MEMS structure. The MEMS structure is disposed between the housing structure and the base structure. Further, the MEMS structure comprises a movable mass, a spring, and an anchor. The anchor is fixed, and the spring extends from the anchor to the movable mass to suspend the movable mass in a cavity between the base structure and the housing structure. During use, the movable mass moves within the cavity. This movement is then sensed via capacitive coupling, a piezoelectric effect, or some other suitable phenomenon. The MEMS package may further integrate one or more optical devices.

A challenge with the MEMS package is that there is a need to control a gap between the movable mass and surrounding structures or devices. In some applications, a gap size (e.g., a gap width or a gap volume) needs to be precisely controlled for considerations such as air flow resistance or heat dissipation of the device inside the MEMS package. For example, a suitable space is needed to prevent the MEMS structure (e.g., the movable mass) from colliding with the surrounding structure (e.g., when the MEMS package is subjected to an external impact or mechanical force) and sustaining damage. Such damage may lead to complete failure of the MEMS structure or may reduce performance (e.g., sensitivity or some other suitable performance metric) of the MEMS structure.

Another challenge with the MEMS package is that the normal deviation or tolerance of a dimension such as height or thickness of a molding material is generally very large, for example, greater than 150 µm. When a certain parameter (e.g., a device-to-housing gap) inside a package structure needs to be sufficiently precise, it is difficult to precisely control and obtain the parameter due to accumulated normal deviations or tolerances of dimensions of a molding material is generally inevitable. As MEMS packages become smaller and smaller and hence more fragile, this challenge is expected to become more and more prominent. Accordingly, an approach to controlling or managing a gap between the MEMS structure and structures surrounding the MEMS structure is therefore of primary importance.

Various embodiments of the present disclosure provide a MEMS package as well as a method for forming the MEMS package that provides one or more improvements over existing approaches. Some embodiments of the present disclosure are directed toward a MEMS package comprising a composite damper, as well as a method for forming the MEMS package. According to some embodiments, the MEMS package comprises a housing structure, a MEMS structure, and the composite damper. The composite damper may be configured to control a gap between the MEMS structure and the housing structure. Particularly, the composite damper may be configured to control a gap between an interconnect wire (or an epoxy structure) of the MEMS structure and a stopper of the housing structure. Because a fluctuation of the composite damper is significantly less than that of a molding material, a variation of the gap may be reduced. Furthermore, with an ability to control the gap inside the MEMS package, sudden shocks to the MEMS package may be dampened. Accordingly, damage may be reduced. Moreover, a performance of the MEMS package may be thereby improved.

FIG. 1 is a cross-sectional view of a MEMS package 10 according to aspects of one or more embodiments of the present disclosure. Referring to FIG. 1, the MEMS package 10 includes a package substrate 110, a housing structure 120 overlying the package substrate 110, and one or more composite dampers 130 between the package substrate 110 and the housing structure 120. The MEMS package 10 may further include a MEMS structure 140 and an image sensor structure 150 between the package substrate 110 and the housing structure 120. The MEMS structure 140 may include an interconnect wire 142 electrically connected to the image sensor structure 150. As described in greater detail below, the composite damper 130 may be configured to control or manage a gap between the MEMS structure 140 (or the interconnect wire 142, or an epoxy structure 144) and the overlying housing structure 120.

The MEMS structure 140 has a movable mass 140$m$, springs 140$s$ and an anchor 140$a$. The anchor 140$a$ is fixed at a periphery of the MEMS structure 140 and has at least a pair of segments respectively on opposite sides of the movable mass 140$m$. The movable mass 140$m$ is movable relative to the anchor 140$a$, e.g., within a cavity 102. The springs 140$s$ are at least respectively on the opposite sides of the movable mass 140$m$ and extend to the movable mass 140$m$ respectively from the segments of the anchor 140$a$ to suspend the movable mass 140$m$ within the cavity 102 and to facilitate movement of the movable mass 140$m$. The MEMS structure 140 may, for example, be a motion sensor structure, an optical image stabilization (OIS) structure, a microphone structure, or some other suitable type of MEMS structure.

In some embodiments, the MEMS structure 140 is or comprises monocrystalline silicon, polycrystalline silicon, or some other suitable type of semiconductor material. In other embodiments, the MEMS structure 140 is or comprises a piezoelectric material or some other suitable type of material. The piezoelectric material may, for example, be or comprise aluminum nitride, lead zirconate titanate (PZT), or some other suitable type of piezoelectric material. In some embodiments, the MEMS structure 140 comprises conductive features embedded therein. For example, a bulk of the MEMS structure 140 may be made up of silicon, a piezoelectric material, or some other suitable type of material, and the conductive features may be embedded therein. The conductive features may, for example, be metal wires, doped semiconductor regions, or other suitable types of conductive features.

The MEMS structure 140 may be disposed over and bonded to a support structure (which is sometimes referred to as a support substrate or a metal plate) 160. In some embodiments, the support structure 160 serves as a carrier substrate for the MEMS structure 140 and is employed to control an operation of the MEMS structure 140. The support structure 160 may be an integrated circuit (IC) die or some other suitable type of substrate. Further, in other embodiments, the support structure 160 is a bulk substrate of silicon or some other suitable type of semiconductor substrate. In some embodiments, the support structure 160 includes an interconnection structure (which is sometimes referred to as a metallization layer or an interconnect layer) disposed over a semiconductor substrate. In some embodiments, the interconnection structure includes an inter-layer dielectric (ILD) layer and an overlying inter-metal dielectric (IMD) layer. A variety of device elements (not shown) may be formed in the semiconductor substrate. Such device elements may include active devices (such as transistors) and/or passive devices (such as resistors and/or capacitors). In order to simplify the diagram, only a single-layer structure is depicted.

In some embodiments, the support structure 160 underlies the MEMS structure 140 and is separated from the MEMS structure 140 by a spacer dielectric layer 162. In some embodiments, at least a portion of the spacer dielectric layer 162 is arranged between the anchor 140$a$ and the support structure 160. In some embodiments, the spacer dielectric layer 162 is a dielectric adhesive or some other suitable material. Further, in some embodiments, the spacer dielectric layer 162 is comprised of silicon oxide and/or some other suitable dielectric(s).

In some embodiments, the MEMS package 10 further includes one or more out-of-plane interconnect wires (which are sometimes referred to as damper wires or wire-bond dampers) 142 electrically connecting the MEMS structure 140 to the image sensor structure 150. The interconnect wires 142 overlie the MEMS structure 140 on the movable mass 140m of the MEMS structure 140 and are respectively on opposite sides of the movable mass 140m. In some embodiments, one end of the interconnect wire 142 is disposed on the movable mass 140m of the MEMS structure 140 and the other end of the interconnect wire 142 is disposed on the image sensor structure 150. In some embodiments, the interconnect wire 142 has a loop-shaped profile and may hence also be known as a loop-type wire. In some embodiments, to prevent damage, the interconnect wires 142 are further configured to absorb kinetic energy of the movable mass 140m when the movable mass 140m gets too close to an overlying structure (e.g., the housing structure 120).

In some embodiments, the MEMS package 10 further includes include one or more epoxy structures 144 respectively surrounding the interconnect wires 142. The epoxy structures 144 overly an upper surface of the MEMS structure 140. In some embodiments, the epoxy structures 144 entirely cover the interconnect wire 142. Alternatively, the epoxy structures 144 surround bases of the interconnect wires 142. In other words, a top portion of the interconnect wire 142 is exposed through the epoxy structure 144. In some embodiments, the epoxy structures 144 enhance strength of the interconnect wires 142 and may therefore prevent excessive deformation of the interconnect wires 142 when sudden shock brings the interconnect wires 142 into contact with the overlying structure (e.g., the housing structure 120).

The housing structure 120 includes one or more stoppers 120a and 120b. The stopper 120a overlies the movable mass 140m in the cavity 102. In some embodiments, the stopper 120a overlies the interconnect wire 142 in the cavity 102. In some embodiments, the stopper 120a faces and is spaced apart from a top of the epoxy structure 144. The stopper 120a may be configured to limit an out-of-plane motion of the movable mass 140m to prevent overextension and hence damage to the springs 140s. The out-of-plane motion corresponds to a motion out of a plane along which the MEMS structure 140 extends. Hence, the out-of-plane motion may be vertical motion as seen in the cross-sectional view of FIG. 1. The stopper 120b overlies a portion of the MEMS structure 140. The stopper 120b contacts the upper surface of the MEMS structure 140. In some embodiments, the stopper 120b overlies the anchor 140a. In some embodiments, the stopper 120b physically contacts the anchor 140a and may be configured to define a space between the anchor 140a and the housing structure 120.

In some embodiments, the stoppers 120a and 120b are referred to as extensions of the housing structure 120. Hence, the stoppers 120a and 120b include a material same as that of a main portion of the housing structure 120. Alternatively, the stopper 120a or the stopper 120b is made of a material different from that of the housing structure 120. For example, the stopper 120a is made of a material same as that of the housing structure 120, while the stopper 120b is made of a material different from that of the housing structure 120. In some embodiments, both stoppers 120a and 120b are made of a material different from that of the housing structure 120.

In some embodiments, the housing structure 120 further includes an optical element 120c. The optical element 120c overlies the image sensor structure 150. The image sensor structure 150 may include an image sensor such as a CMOS image sensor (CIS) or a charge-coupled device (CCD). The optical element 120c may include an optical filter such as an infrared radiation (IR) cut filter. In some embodiments, a gap G1 may be selected such that a proper focal length between the optical element 120c and the image sensor structure 150 may be obtained. Alternatively, the gap G1 may be selected such that a proper travel distance of the movable mass 140m may be obtained. In other words, if the gap G1 is too small, the movable mass 140m may have too little distance to travel and may not provide useful function. On the other hand, if the gap G1 is too large, the springs 140s may be overextended and hence damage to the springs 140s may occur. In some embodiments, the gap G1 is in a range between about 20 μm and about 30 μm.

In some embodiments, the cavity 102 is hermetically sealed, such that the cavity 102 is separated from an atmosphere on an opposite side of the housing structure 120 from the cavity 102. In some embodiments, the housing structure 120 extends along sidewalls of the MEMS structure 140 and the support structure 160 to the package substrate 110 underlying the support structure 160. In some embodiments, the housing structure 120 is comprised of a polymer, silicon, some other suitable material, or any combination of the foregoing.

In some embodiments, the package substrate 110 is a printed circuit board (PCB). In some embodiments, the package substrate 110 includes one or more conductive pads 112 to facilitate electrical coupling between the support structure 160 and the package substrate 110. The package substrate 110 may include a plurality of conductive traces (not shown), vias (not shown), and/or other conductive features to facilitate electrical coupling from an underside of the package substrate 110 to the support structure 160.

The package substrate 110 underlies the housing structure 120 and is coupled to the housing structure 120 by one or more of the composite dampers 130. The composite damper 130 may be configured to control or manage the gap G1 between the MEMS structure 140 (or the interconnect wire 142, or the epoxy structure 144) and the overlying housing structure 120 such that a proper travel distance of the movable mass 140m or a proper focal length between the optical element 120c and the image sensor structure 150 may be obtained. In some embodiments, the composite damper 130 has a thickness T1 ranging from approximately 330 μm to approximately 370 μm.

The composite damper 130 may include a stack of a conductive element 132 and a buffer layer 134. In some embodiments, the conductive element 132 includes a conductive ball, a conductive pillar, a conductive post, a conductive bump, or the like. In some embodiments, the conductive element 132 is in a cylindrical, spherical or hemispherical shape. In some embodiments, the conductive element 132 is a solder joint, a solder bump, a solder ball, a ball grid array (BGA) ball, a controlled collapse chip connection (C4) bump, microbump or the like. In some embodiments, a cross section of the conductive element 132 may be any of various shapes such as circle, triangle, rectangle, square or the like. In some embodiments, a material of the conductive element 132 includes a variety of metals, metal alloys, or metals and a mixture of other materials. For example, the conductive element 132 may be made of aluminum, copper, gold, lead, titanium, tungsten, tin, nickel, and/or alloys thereof. In some embodiments, a diameter of the conductive element 132 is in a range between about 0.15 mm and about 0.76 mm. In some embodiments, a melting point of the conductive element 132 is in a range between about 95° C. and about 309° C.

In some embodiments, the buffer layer 134 is disposed over the conductive element 132 and surrounds the conductive element 132. In some embodiments, the buffer layer 134 is between the conductive element 132 and the housing structure 120. In some embodiments, the buffer layer 134 fills a space between the conductive element 132 and the housing structure 120. In some embodiments, the buffer layer 134 encapsulates the conductive element 132. In some embodiments, the buffer layer 134 is an electrically insulated adhesive for protecting the conductive element 132. In some embodiments, the buffer layer 134 is an electrically insulated adhesive for securing a bond between the package substrate 110 and the housing structure 120 or between the conductive element 132 and the housing structure 120. In some embodiments, the buffer layer 134 includes a glue material or a fusion material. For example, the buffer layer 134 may include gel, rubber, or the like. In some embodiments, the buffer layer 134 includes epoxy, resin, molding compounds, or the like. The buffer layer 134 may include a single homogenous composition in some embodiments, while in other embodiments may include multiple regions or layers with different material compositions. In some embodiments, a total thickness of the conductive element 132 and the buffer layer 134 is in a range between about 330 µm and about 370 µm. In alternative embodiments, the conductive element 132 may directly contact the housing structure 120, and the buffer layer 134 between the housing structure 120 and the conductive element 132 is omitted.

In some embodiments, the composite damper 130 further includes a conductive pad 136 and a dielectric layer 138. In some embodiments, the conductive pad 136 is an under-bump metallurgy (UBM) layer. In some embodiments, the conductive pad 136 is formed with a conductive material such as gold, silver, copper, nickel, tungsten, aluminum, and/or alloys thereof. In some embodiments, the conductive pad 136 acts as a plating-enabling layer. In some embodiments, the conductive pads 136 are insulated or separated from one another by the dielectric layer(s) 138. In some embodiments, the dielectric layer 138 is made of polymers, such as polyimide, and can be referred to as a passivation layer.

In some embodiments, the conductive elements 132 may be placed on the package substrate 110 through the dielectric layer 138 and may be a ball grid array (BGA) which comprises a eutectic material such as solder, although any suitable materials may alternatively be used. Optionally, an under-bump metallization (e.g., the conductive pad 136) may be utilized between the conductive elements 132 and the package substrate 110. In an embodiment in which the conductive elements 132 are solder balls, the conductive elements 132 may be formed using a ball drop method, such as a direct ball drop process. Alternatively, the solder balls may be formed by initially forming a layer of solder material through any suitable method such as evaporation, electroplating, printing, solder transfer, ball placement, or the like. Once the layer of solder material has been formed on the package substrate 110, a reflow may be performed in order to shape the solder material into the desired bump shapes. In another embodiment, the conductive elements 132 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on tops of the metal pillars. The metal cap layer may include nickel, tin, tin-lead, gold, silver, palladium, indium, nickel-palladium-gold, nickel-gold, the like, or a combination thereof and may be formed by a plating process.

The proposed MEMS package 10 provides advantages. In some comparative embodiments where the composite damper 130 is absent, a fluctuation or an extension of a molding material is generally very large, for example, greater than 150 µm. Hence, it is difficult to control the gap G1 because the fluctuation or extension of the molding material is generally inevitable. The proposed MEMS package 10 includes the composite damper 130. The composite damper 130 (or the conductive element 132) has less fluctuation or extension. For example, in some embodiments, the fluctuation (e.g., the thickness T1) of the composite damper 130 is substantially 350 micrometers plus or minus 20 micrometers. Because a fluctuation or a deviation of the composite damper 130 is significantly less than that of the molding material, the variation of the gap G1 may be reduced. Accordingly, the composite damper 130 may provide advanced control or management of the gap G1 between the MEMS structure 140 (or the interconnect wire 142) and the housing structure 120 due to small fluctuation or extension of the composite damper 130. Furthermore, with the ability to control the gap G1 inside the MEMS package 10, sudden shock to the MEMS package may be dampened and damage to springs 140s may be reduced. Moreover, a better performance of the MEMS package 10 may be achieved.

With continued reference to FIG. 1, the package substrate 110 underlies the MEMS structure 140 and is separated from the support structure 160 by a spacer layer 170. In some embodiments, the spacer layer 170 is a dielectric layer which includes silicon oxide and/or some other suitable dielectric(s). Further, in some embodiments, the spacer layer 170 is a dielectric adhesive or some other suitable material.

The structures of the present disclosure are not limited to the above-mentioned embodiments and may have other different embodiments. To simplify the description and for convenience of comparison between each of the embodiments of the present disclosure, identical (or like) components in each of the following embodiments are marked with identical (or like) numerals. For making it easier to compare differences between the embodiments, the following description will detail dissimilarities among different embodiments, while description of identical features, values and definitions will not be repeated.

Figure 2:
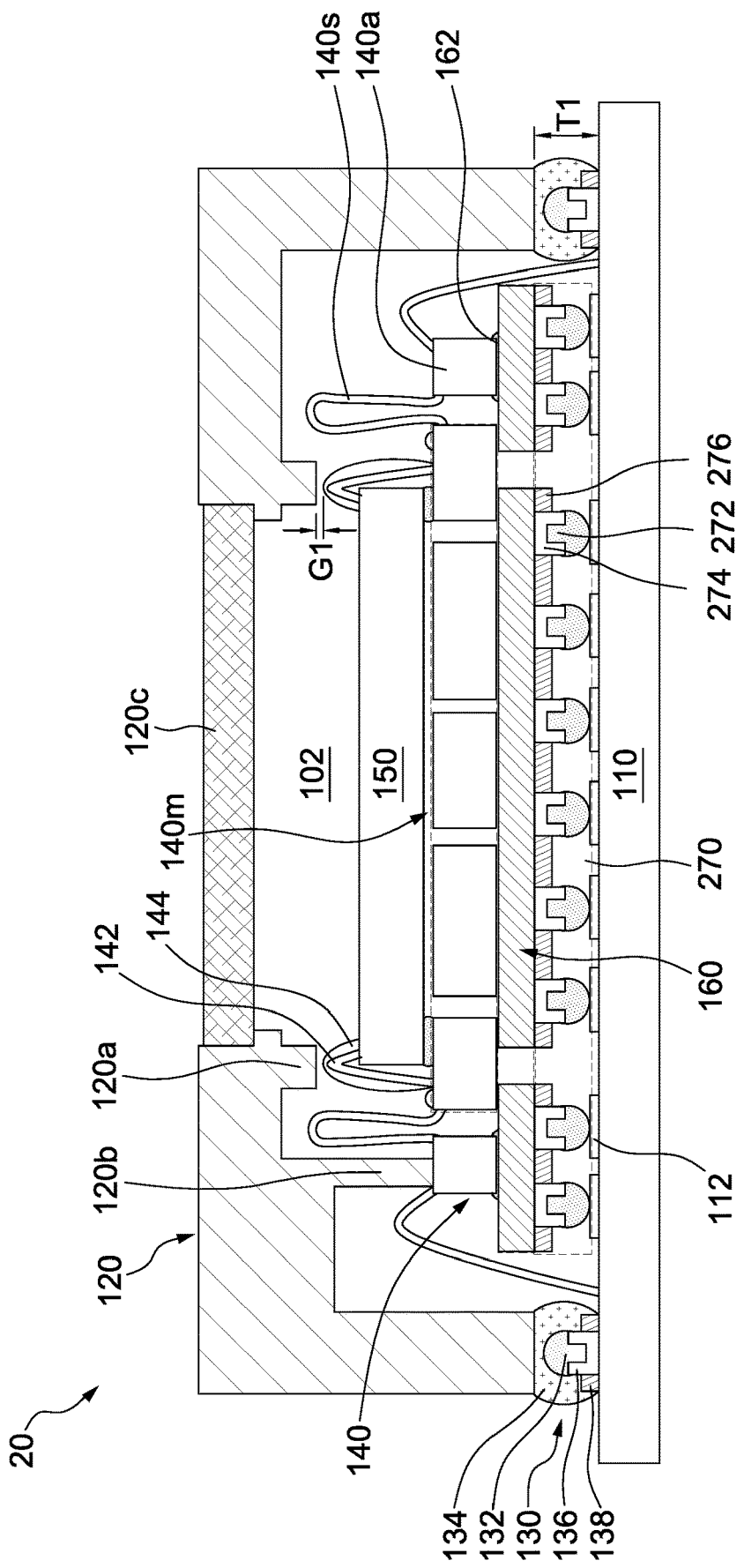
FIG. 2 is a cross-sectional view of a MEMS package according to aspects of one or more embodiments of the present disclosure.

FIG. 2 is a cross-sectional view of a MEMS package 20 according to aspects of one or more embodiments of the present disclosure. The MEMS package 20 in FIG. 2 is similar to the MEMS package 10 in FIG. 1, except the MEMS package 20 includes a spacer layer 270 between the package substrate 110 and the support structure 160. In some embodiments, the spacer layer 270 includes a ball grid array. In some embodiments, the spacer layer 270 includes several conductive bumps 272 disposed below the support structure 160. In some embodiments, the conductive bump 272 is in a cylindrical, spherical or hemispherical shape. In some embodiments, the conductive bump 272 is a solder joint, a solder bump, a solder ball, a ball grid array (BGA) ball, a controlled collapse chip connection (C4) bump, microbump or the like. In some embodiments, the conductive bump 272 is a conductive pillar or post. In some embodiments, the conductive bump 272 includes metals such as lead, tin, copper, gold, nickel, or the like.

In some embodiments, the conductive bump 272 is electrically connected to the conductive pads 112 on the package substrate 110. The conductive bump 272 electrically couples the support structure 160 to the conductive pads 112 and/or the conductive traces on the package substrate 110. The package substrate 110 may be configured to receive components, such as integrated chips, heat sinks, and/or discrete devices such as capacitors, resistors, inductors, and the like; and includes conductive features contained within a mechanical structure to couple the components to one another. The conductive features include copper traces, pads, or conductive planes, and the mechanical structure is formed with insulating material laminated between layers of conductive material. In some embodiments, both the conductive bump 272 and the conductive element 132 have circular cross-sections, but the conductive bump 272 may have a diameter different from that of the conductive element 132. For example, the conductive bump 272 may have a diameter smaller than the diameter of the conductive element 132.

In some embodiments, the spacer layer 270 further includes several conductive pads 274, and the conductive bump 272 is disposed at the conductive pad 274. In some embodiments, the conductive pad 274 is an under-bump metallurgy (UBM) layer. In some embodiments, the conductive pad 274 is formed with a conductive material such as gold, silver, copper, nickel, tungsten, aluminum, and/or alloys thereof. In some embodiments, the spacer layer 270 further includes a dielectric layer 276. In some embodiments, the conductive pads 274 are insulated or separated from one another by the dielectric layer(s) 276. In some embodiments, the dielectric layer 276 is made of polymers, such as polyimide, and can be referred to as a passivation layer(s).

The proposed MEMS package 20 provides advantages. In some embodiments, a fluctuation or a deviation of the spacer layer 270 may be less than that of the spacer layer 170. Accordingly, the variation of the gap G1 may be further reduced. Hence, the presence of the spacer layer 270 and the composite damper 130 provide advanced control or management of the gap G1 between the MEMS structure 140 (or the interconnect wire 142) and the housing structure 120 due to small fluctuation or extension of the composite damper 130 and small fluctuation or extension of the spacer layer 270. Accordingly, a better performance of the MEMS package 20 may be achieved.

Figure 3:
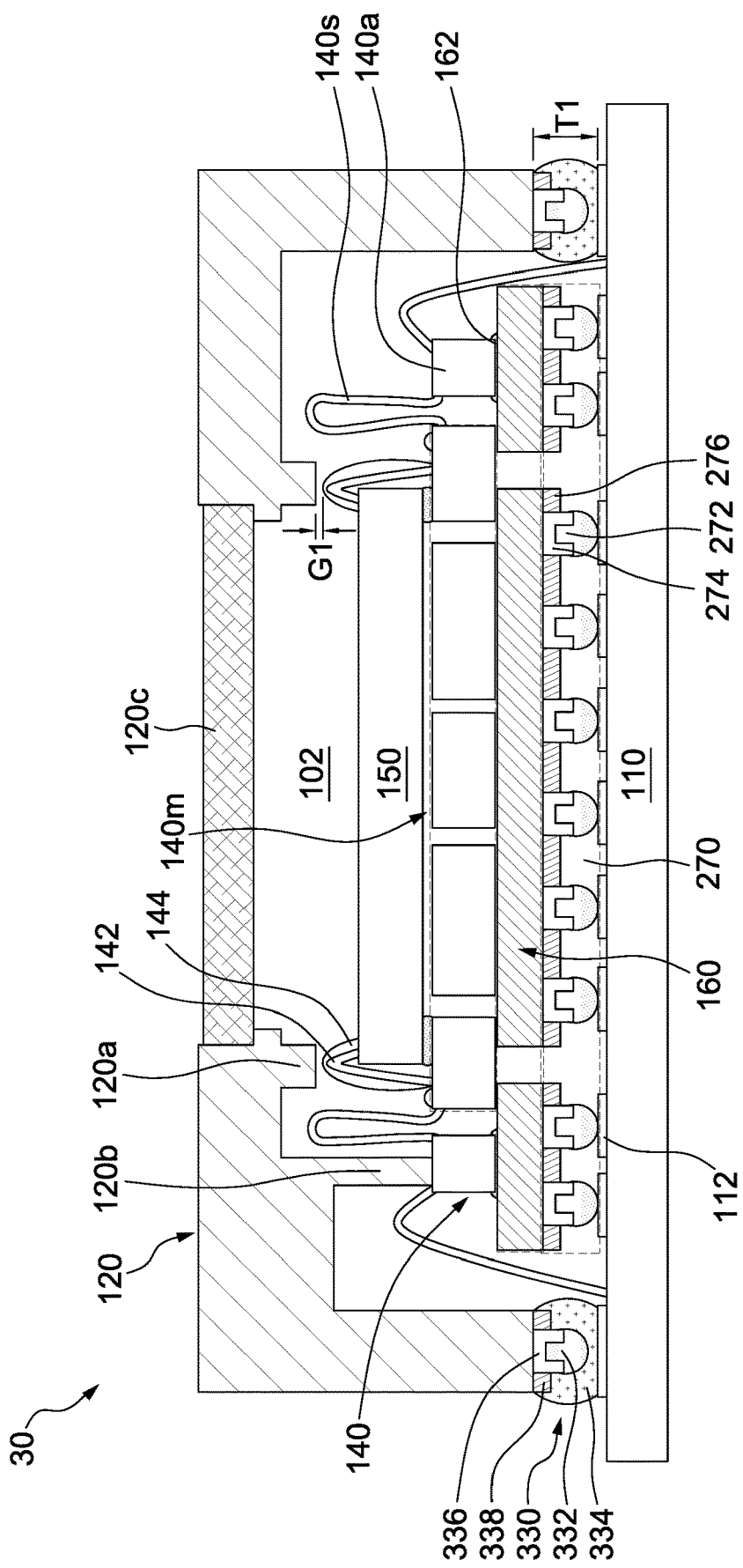
FIG. 3 is a cross-sectional view of a MEMS package according to aspects of one or more embodiments of the present disclosure.

FIG. 3 is a cross-sectional view of a MEMS package 30 according to aspects of one or more embodiments of the present disclosure. The MEMS package 30 in FIG. 3 is similar to the MEMS package 20 in FIG. 2, except the MEMS package 30 includes a composite damper 330 between the package substrate 110 and the housing structure 120. In some embodiments, the composite damper 330 may include a stack of a conductive element 332 and a buffer layer 334. In some embodiments, the composite damper 330 further includes a conductive pad 336 and a dielectric layer 338. Many aspects of the conductive element 332, the buffer layer 334, the conductive pad 336 and the dielectric layer 338 in FIG. 3 are similar to those of the conductive element 132, the buffer layer 134, the conductive pad 136 and the dielectric layer 138 in FIG. 1, and are hereby omitted from discussion for brevity.

In some embodiments, the conductive elements 332 may be placed on the housing structure 120 through the dielectric layer 338 and may be a ball grid array (BGA) which comprises a eutectic material such as solder, although any suitable materials may alternatively be used. Optionally, an under-bump metallization (e.g., the conductive pad 336) may be utilized between the conductive elements 332 and the housing structure 120. In some embodiments, the conductive element 332 may be spaced apart from the conductive pad 112 on the package substrate 110 by the buffer layer 334. Alternatively, the conductive element 332 may directly contact the conductive pad 112 on the package substrate 110. While FIG. 3 illustrates the spacer layer 270 being utilized between the package substrate 110 and the support structure 160, the spacer layer 170 may also be utilized between the package substrate 110 and the support structure 160 as shown in FIG. 1. The proposed MEMS package 30 provides advantages. The presence of the composite damper 330 provides advanced control or management of the gap G1 between the MEMS structure 140 (or the interconnect wire 142) and the housing structure 120 due to small fluctuation or extension of the composite damper 330. Accordingly, a better performance of the MEMS package 30 may be achieved.

Figure 4:
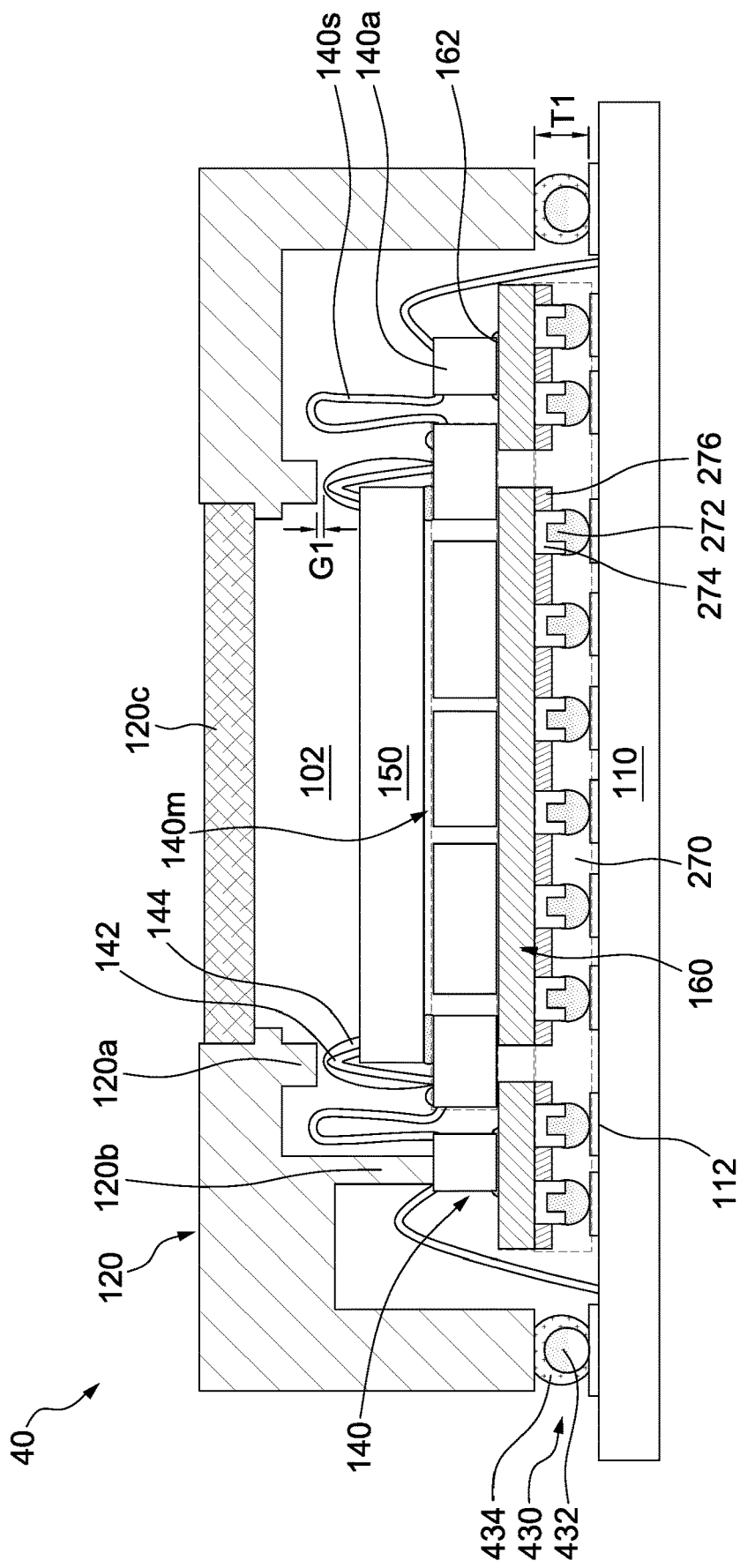
FIG. 4 is a cross-sectional view of a MEMS package according to aspects of one or more embodiments of the present disclosure.

FIG. 4 is a cross-sectional view of a MEMS package 40 according to aspects of one or more embodiments of the present disclosure. The MEMS package 40 in FIG. 4 is similar to the MEMS package 30 in FIG. 3, except the MEMS package 40 includes a composite damper 430 between the package substrate 110 and the housing structure 120. In some embodiments, the composite damper 430 may include a stack of a conductive element 432 and a buffer layer 434. Many aspects of the conductive element 432 and the buffer layer 434 in FIG. 4 are similar to those of the conductive element 132 and the buffer layer 134 in FIG. 1, and are hereby omitted from discussion for brevity.

In some embodiments, the conductive elements 432 may be placed on the housing structure 120 through the buffer layer 434 and may comprise a eutectic material such as solder, although any suitable materials may alternatively be used. In some embodiments, the conductive element 432 may directly contact the conductive pad 112 on the package substrate 110. In alternative embodiments, the conductive element 432 may directly contact the housing structure 120, and the buffer layer 434 between the housing structure 120 and the conductive element 432 is omitted. While FIG. 4 illustrates the spacer layer 270 being utilized between the package substrate 110 and the support structure 160, the spacer layer 170 may also be utilized between the package substrate 110 and the support structure 160 as shown in FIG. 1. The proposed MEMS package 40 provides advantages. The presence of the composite damper 430 provides advanced control or management of the gap G1 between the MEMS structure 140 (or the interconnect wire 142) and the housing structure 120 due to small fluctuation or extension of the composite damper 430. Accordingly, a better performance of the MEMS package 40 may be achieved.

Figure 5:
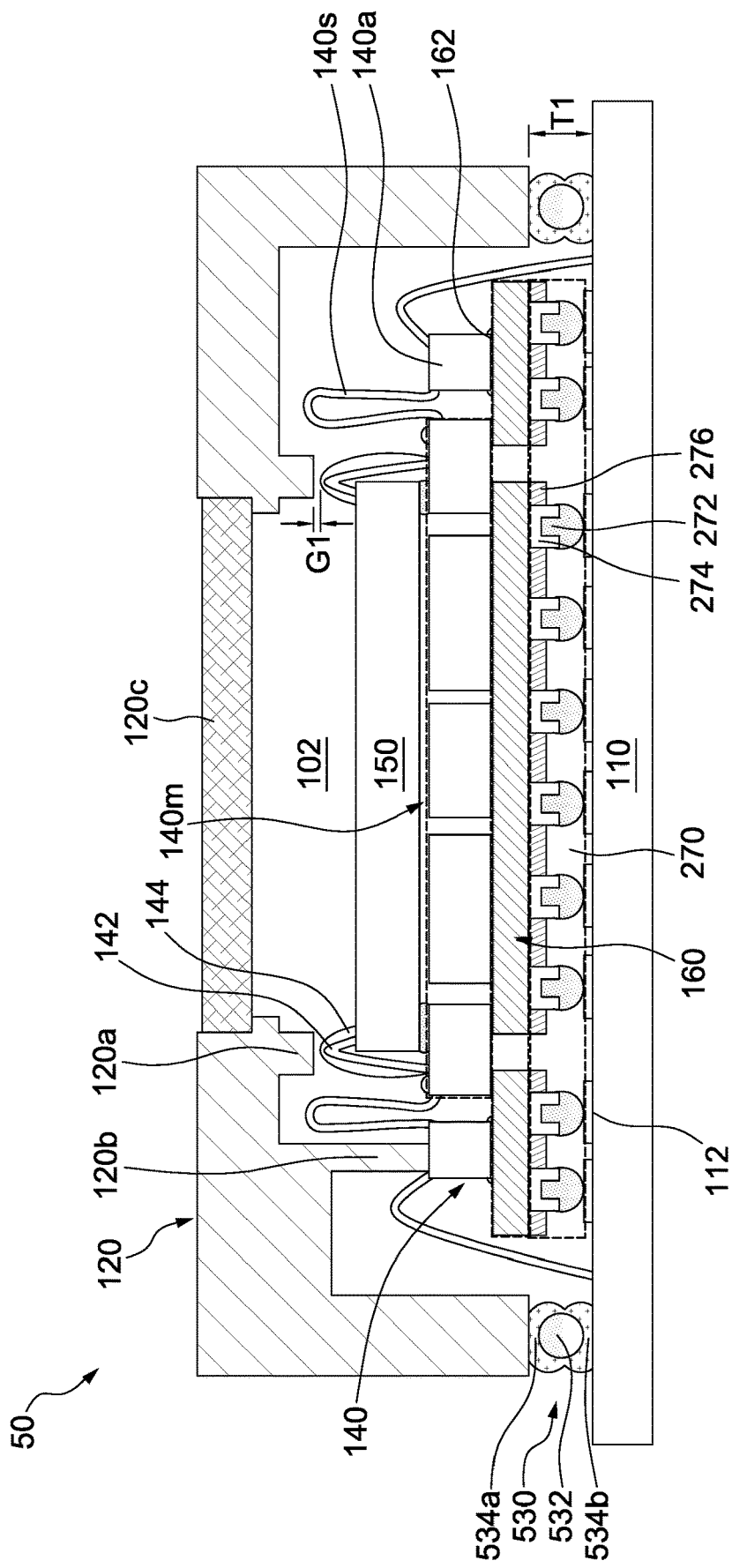
FIG. 5 is a cross-sectional view of a MEMS package according to aspects of one or more embodiments of the present disclosure.

FIG. 5 is a cross-sectional view of a MEMS package 50 according to aspects of one or more embodiments of the present disclosure. The MEMS package 50 in FIG. 5 is similar to the MEMS package 40 in FIG. 4, except the MEMS package 50 includes a composite damper 530 between the package substrate 110 and the housing structure 120. In some embodiments, the composite damper 530 may include a stack of a conductive element 532 and one or more buffer layers 534a and 534b. Many aspects of the conductive element 532 and the buffer layer 534a, 534b in FIG. 5 are similar to those of the conductive element 132 and the buffer layer 134 in FIG. 1, and are hereby omitted from discussion for brevity.

In some embodiments, the conductive elements 532 may be placed on the housing structure 120 through the buffer layer 534a. Alternatively or additionally, the conductive elements 532 may be placed on the package substrate 110 through the buffer layer 534b. The conductive elements 532 may be spaced apart from the housing structure 120 and the package substrate 110 by the buffer layer 534a and the buffer layer 534b, respectively. In some embodiments, the conductive element 532 may directly contact the housing structure 120 while being spaced apart from the package substrate 110. In some embodiments, the conductive element 532 may directly contact the package substrate 110 while being spaced apart from the housing structure 120. In alternative embodiments, the conductive element 532 may directly contact the housing structure 120 and the package substrate 110, and the buffer layer 534a between the housing structure 120 and the conductive element 532, and the buffer layer 534b between the package substrate 110 and the conductive element 532, are omitted.

While FIG. 5 illustrates the spacer layer 270 being utilized between the package substrate 110 and the support structure 160, the spacer layer 170 may also be utilized between the package substrate 110 and the support structure 160 as shown in FIG. 1. The proposed MEMS package 50 provides advantages. The presence of the composite damper 530 provides advanced control or management of the gap G1 between the MEMS structure 140 (or the interconnect wire 142) and the housing structure 120 due to small fluctuation or extension of the composite damper 530. Accordingly, a better performance of the MEMS package 50 may be achieved.

Figure 6:
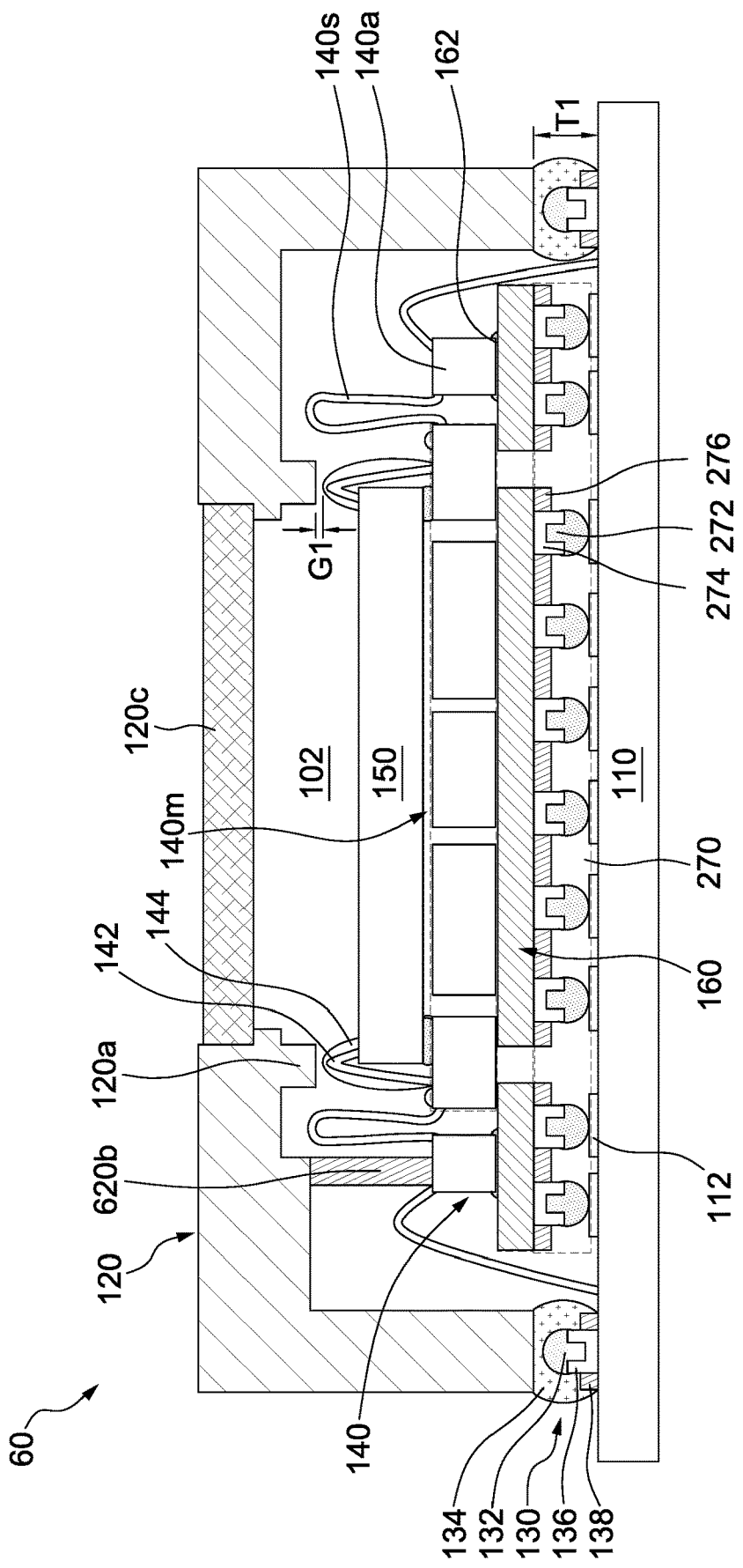
FIG. 6 is a cross-sectional view of a MEMS package according to aspects of one or more embodiments of the present disclosure.

FIG. 6 is a cross-sectional view of a MEMS package 60 according to aspects of one or more embodiments of the present disclosure. The MEMS package 60 in FIG. 6 is similar to the MEMS package 20 in FIG. 2, except the MEMS package 60 includes a stopper 620b overlying the anchor 140a. In some embodiments, the stopper 620b is comprised of a material different from that of the housing structure 120. In some embodiments, the stopper 620b is comprised of a material different from that of the stopper 120a. In some embodiments, the stopper 620b includes conductive materials, while the stopper 120a includes dielectric materials. In some embodiments, the stopper 620b physically contacts the anchor 140a and the housing structure 120. In some embodiments, the stopper 620b may be configured to define a space between the anchor 140a and the housing structure 120.

While FIG. 6 illustrates the spacer layer 270 being utilized between the package substrate 110 and the support structure 160, the spacer layer 170 may also be utilized between the package substrate 110 and the support structure 160 as shown in FIG. 1. The proposed MEMS package 60 provides advantages. The presence of the stopper 620b having material different from the housing structure 120 may provide better control or management of the gap G1 between the MEMS structure 140 (or the interconnect wire 142) and the housing structure 120. Accordingly, a better performance of the MEMS package 60 may be achieved.

Figure 7:
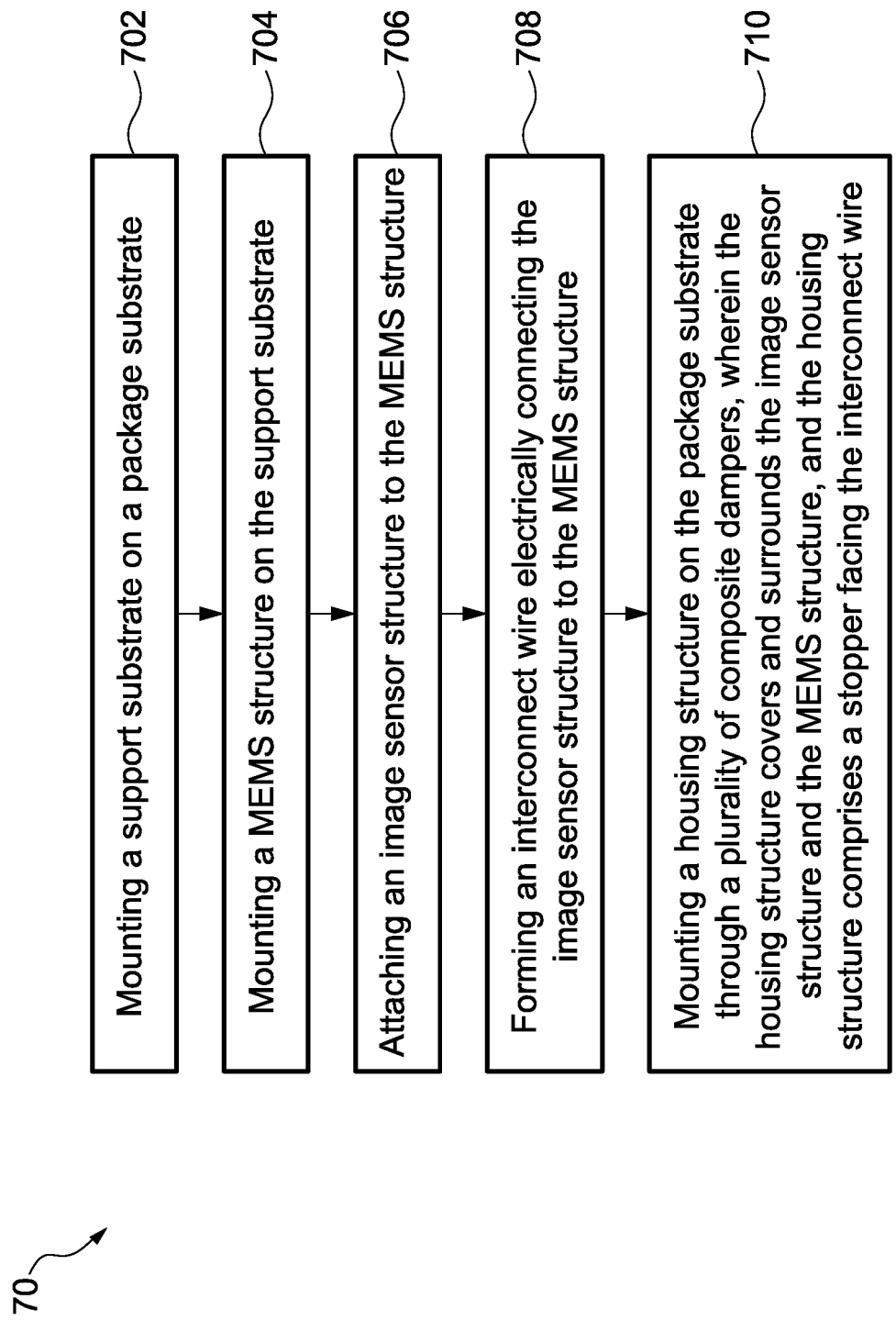
FIG. 7 is a flowchart representing a method for forming a MEMS package according to aspects of one or more embodiments of the present disclosure.

FIG. 7 is a flowchart representing a method 70 for forming a MEMS package according to aspects of one or more embodiments of the present disclosure. The method 70 includes an operation 702, in which a support substrate is mounted on a package substrate. The method 70 includes an operation 704, in which a MEMS structure is mounted on the support substrate. The method 70 includes an operation 706, in which an image sensor structure is attached to the MEMS structure. The method 70 includes an operation 708, in which an interconnect wire electrically connecting the image sensor structure to the MEMS structure is formed. The method 70 includes an operation 710, in which a housing structure is mounted on the package substrate through a plurality of composite dampers. In some embodiments, the housing structure covers and surrounds the image sensor structure and the MEMS structure, and the housing structure comprises a stopper facing the interconnect wire. The method 70 will be further described according to one or more embodiments. It should be noted that the operations of the method 70 may be rearranged or otherwise modified within the scope of the various aspects. It should further be noted that additional processes may be provided before, during, and after the method 70, and that some other processes may only be briefly described herein. Thus, other implementations are possible within the scope of the various aspects described herein.

FIGS. 8 to 13 are schematic drawings illustrating a method for forming a MEMS package at various fabrication stages constructed according to aspects of one or more embodiments of the present disclosure. FIGS. 8 to 13 illustrate formation of the spacer layer 270 over the support structure 160.

Figure 8:
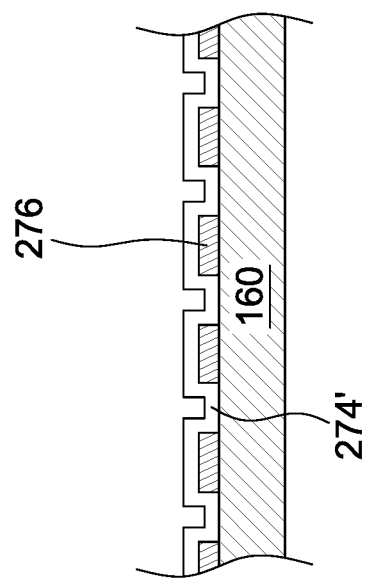
FIGS. 8-13 are schematic drawings illustrating a method for forming a MEMS package at various fabrication stages constructed according to aspects of one or more embodiments of the present disclosure.

Referring to FIG. 8, the support structure 160 is received or provided. In some embodiments, the dielectric layer 276 is formed over the support structure 160. In some embodiments, after the dielectric layer 276 has been formed, one or more openings may be made through the dielectric layer 276 by removing portions of the dielectric layer 276 to expose at least a portion of the underlying support structure 160. The opening allows for contact between the conductive features of the support structure 160 and the conductive pad 274 (see FIG. 12) or the conductive bump 272 (see FIG. 13). The opening may be formed using a suitable photolithographic mask and etching process, although any suitable process to expose portions of the support structure 160 may be used.

In some embodiments, a conductive layer 274' (e.g., an under-bump metallization layer) is formed over the support structure 160. In some embodiments, after the patterned dielectric layer 276 is formed, the conductive layer 274' (e.g., the under-bump metallization layer) is formed over the dielectric layer 276. In some embodiments, the formation of the conductive layer 274' includes a sputtering operation, although any suitable process to form the conductive layer 274' may be used. By using the sputtering operation, the conductive layer 274' is deposited not only on exposed portions of the support structure 160, but also on the top surface of the dielectric layer 276.

Figure 9:
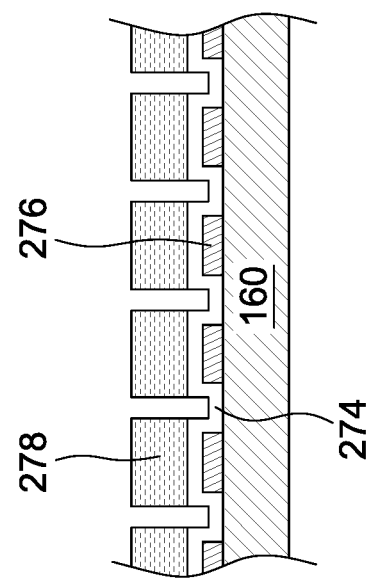

Referring to FIG. 9, in some embodiments, a patterned layer 278 is formed over the conductive layer 274' for defining a location and a dimension of the conductive bump 272 to be formed. In some embodiments, a layer (e.g., a layer of photoresist, not shown) is formed over the conductive layer 274' by a suitable process, such as spin-on coating, and is then patterned by a proper lithography patterning method, forming the patterned layer 278.

Figure 10:
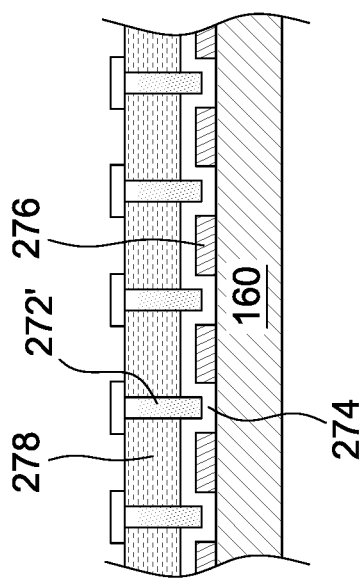

Referring to FIG. 10, in some embodiments, a layer of conductive material 272' is formed over the patterned layer 278. In some embodiments, the layer of conductive material 272' is formed over the conductive layer 274'. The layer of conductive material 272' may be formed through any suitable method such as evaporation, electroplating, printing, solder transfer, ball placement, or the like. In some embodiments, the layer of conductive material 272' is deposited not only on exposed portions of the conductive layer 274', but also on the top surface of the patterned layer 278.

Figure 11:
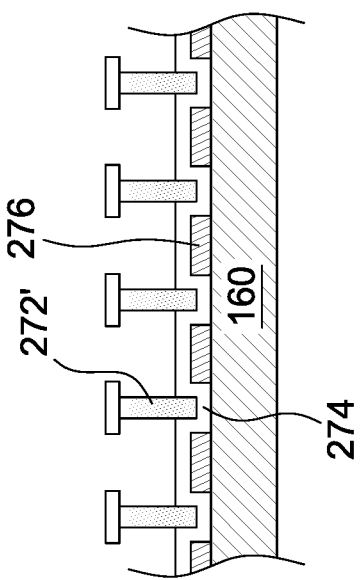

Referring to FIG. 11, in some embodiments, after the formation of the layer of conductive material 272', the patterned layer 278 is removed. The patterned layer 278 may be removed using a suitable process, such as wet stripping or plasma ashing.

Figure 12:
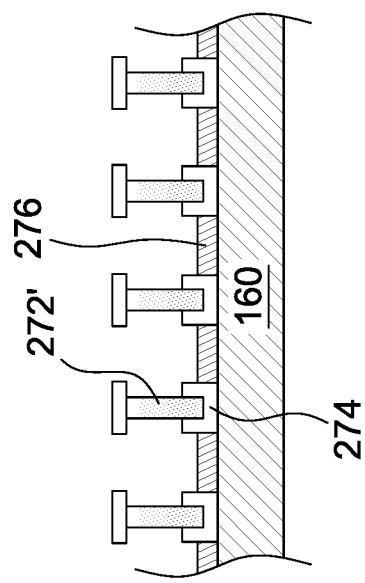

Referring to FIG. 12, in some embodiments, the conductive layer 274' is etched, forming the conductive pads 274. In one example, the etching process includes applying a dry (or plasma) etch to remove portions of the conductive layer 274'. In another example, the etching process includes applying a wet etch with an etching solution to remove the portions of the conductive layer 274'.

Figure 13:
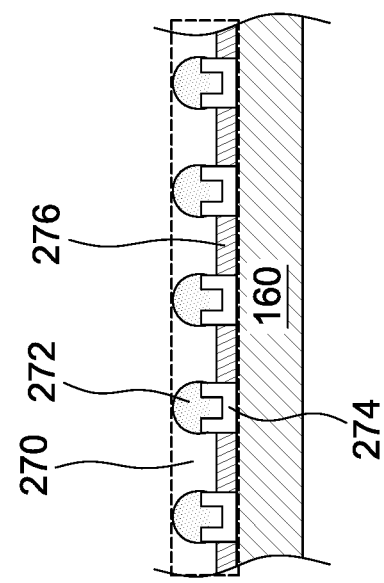

Referring to FIG. 13, in some embodiments, a reflow is preformed to shape the conductive material 272' into a desired shape. In some embodiments, the reflow is preformed to shape the conductive material 272' into a desired bump shape. Accordingly, the conductive bumps 272 are formed.

FIGS. 14 to 18 are schematic drawings illustrating a method for forming a MEMS package at various fabrication stages constructed according to aspects of one or more embodiments of the present disclosure. FIGS. 14 to 18 illustrate the formation of the MEMS package 20. The method and variations thereof may, for example, be employed to form the MEMS package in any of FIGS. 1 and 3 to 6.

Figure 14:
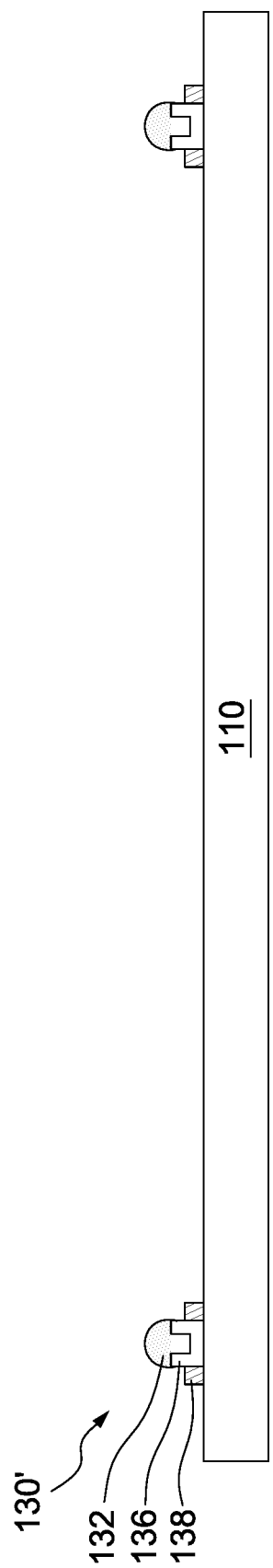
FIGS. 14-18 are schematic drawings illustrating a method for forming a MEMS package at various fabrication stages constructed according to aspects of one or more embodiments of the present disclosure.

Referring to FIG. 14, a package substrate 110 is received or provided. In some embodiments, one or more composite dampers 130' are provided or formed on the package substrate 110. The formation of the composite dampers 130' includes the following operations. For example, an under-bump metallization layer (i.e., a conductive layer for forming the conductive pads 136) is formed over the package substrate 110. Subsequently, a conductive material (e.g., a layer of conductive material for forming the conductive elements 132) is formed over the under-bump metallization layer. Next, a reflow is performed to shape the conductive material into a desired shape (i.e., for forming the conductive elements 132). In some embodiments, prior to the formation of the under-bump metallization layer, a dielectric layer is formed (i.e., for forming the dielectric layer 138). Many aspects of the formation of the composite dampers 130' in FIG. 14 are similar to aspects of the formation of the conductive bumps 272, the conductive pads 274 and the dielectric layer 276 in FIGS. 8 to 13, and are hereby omitted from discussion for brevity.

Figure 15:
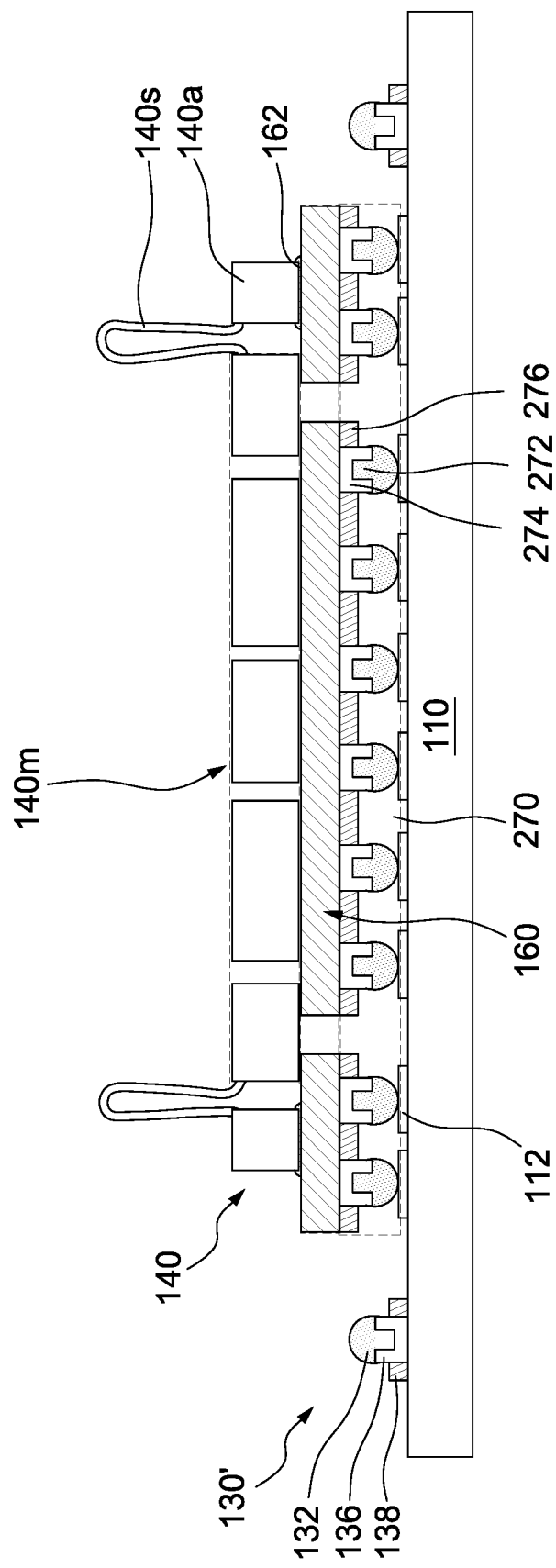

Referring to FIG. 15, a support structure 160 is mounted on the package substrate 110. In other words, the support structure 160 is arranged on and secured to the package substrate 110. The respective step is shown as the operation 702 of the method 70 in FIG. 7. The support structure 160 may, for example, be secured to the package substrate 110 by an adhesive, by fusion bonding, or by some other suitable approach to mounting. In some embodiments, the support structure 160 is mounted on the package substrate 110 through the spacer layer 270. In some embodiments, the conductive element 332 of the spacer layer 270 directly contacts the conductive pad 112 on the package substrate 110. Alternatively, the support structure 160 is mounted on the package substrate 110 through the spacer layer 170 (as shown in FIG. 1).

With continued reference to FIG. 15, a MEMS structure 140 is mounted on the support structure 160. In other words, the MEMS structure 140 is arranged over and secured to the support structure 160. The respective step is shown as the operation 704 of the method 70 in FIG. 7. In some embodiments, the MEMS structure 140 is arranged over and secured to the support structure 160 through a spacer dielectric layer 162. In some embodiments, the MEMS structure 140 is secured to the support structure 160 by an adhesive, by fusion bonding, or by some other suitable approach to mounting. For example, the spacer dielectric layer 162 may be a dielectric adhesive and may be employed to adhere the MEMS structure 140 to the support structure 160.

Figure 16:
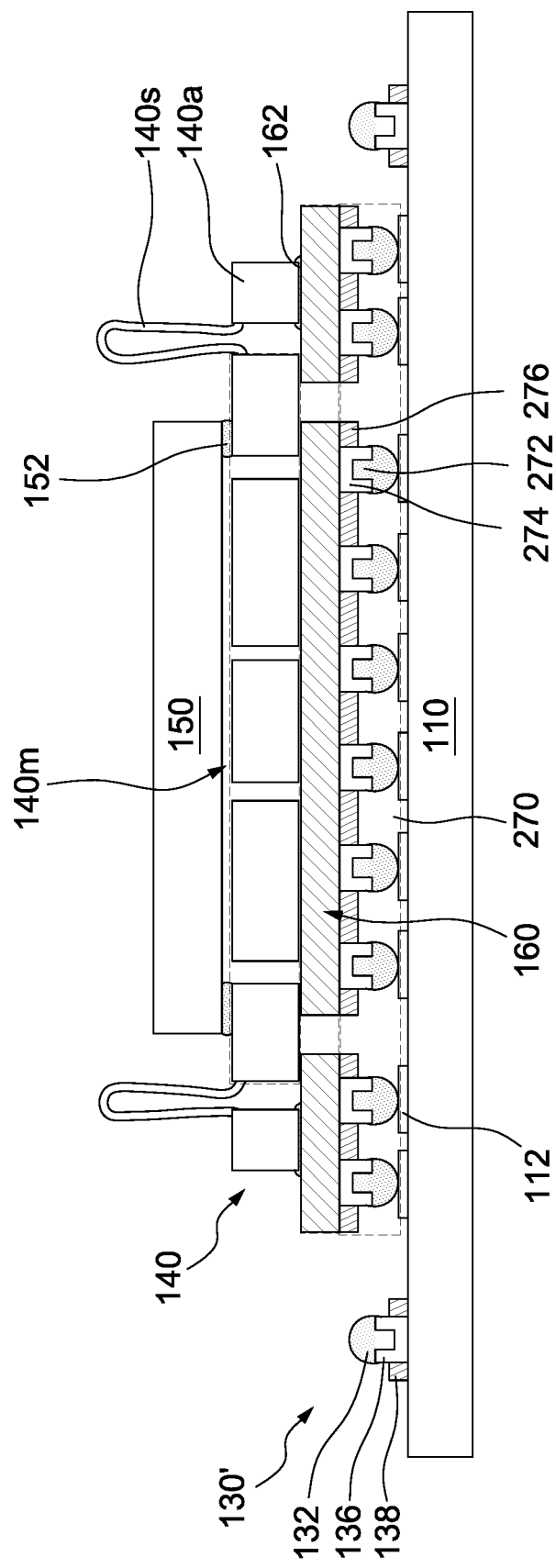

Referring to FIG. 16, an image sensor structure 150 is attached to or mounted on the MEMS structure 140. The respective step is shown as the operation 706 of the method 70 in FIG. 7. In some embodiments, the image sensor structure 150 is attached to or mounted on the MEMS structure 140 through a spacer dielectric layer 152. In some embodiments, at least a portion of the spacer dielectric layer 152 is arranged between the movable mass 140m and the image sensor structure 150. In some embodiments, the image sensor structure 150 is secured to the MEMS structure 140 by an adhesive, by fusion bonding, or by some other suitable approach to mounting. For example, the spacer dielectric layer 152 may be a dielectric adhesive and may be employed to adhere the image sensor structure 150 to the MEMS structure 140.

Figure 17:
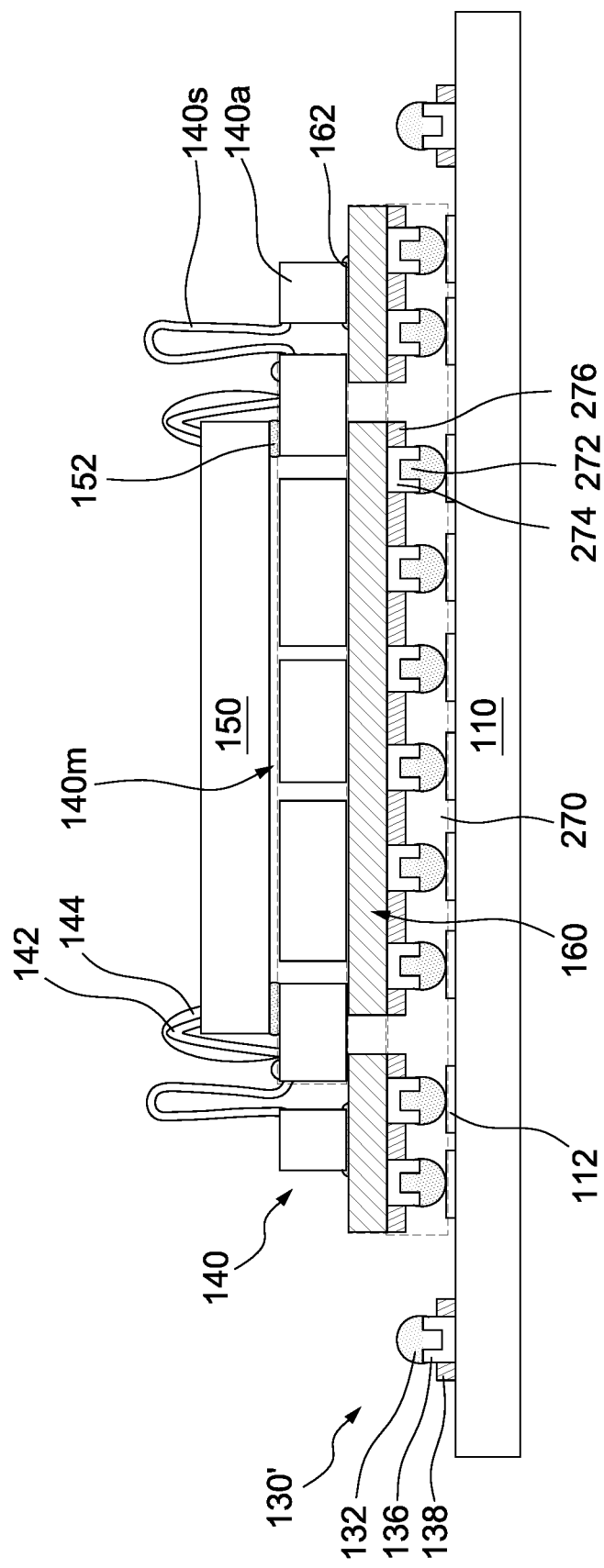

Referring to FIG. 17, one or more interconnect wires 142 electrically connecting the image sensor structure 150 to the MEMS structure 140 are formed. The respective step is shown as the operation 708 of the method 70 in FIG. 7. In some embodiments, a wire-bonding process is performed to form the interconnect wires 142. The interconnect wires 142 arch between the MEMS structure 140 and the image sensor structure 150, such that the interconnect wires 142 have loop-shaped profiles and may hence also be known as loop-type wires. The interconnect wires 142 may be inserted into a top of the MEMS structure 140. In some embodiments, the interconnect wires 142 are electrically coupled to the movable mass 140m and/or to conductive features in the movable mass 140m. The interconnect wires 142 extend respectively from the top of the MEMS structure 140 to a top of the image sensor structure 150. In some embodiments, the interconnect wires 142 are electrically coupled to the image sensor structure 150 and/or to conductive features in the image sensor structure 150. The interconnect wires 142 are conductive and may, for example, be or comprise gold, copper, silver, aluminum, some other suitable metal element(s), or any combination of the foregoing. In alternative embodiments, the interconnect wires 142 are electrically floating.

As illustrated in FIG. 17, epoxy structures 144 are deposited respectively on the interconnect wires 142. The epoxy structures 144 enhance strength of the interconnect wires 142 and may therefore prevent excessive deformation of the interconnect wires 142 during damping. In alternative embodiments, the epoxy structures 144 are not formed.

Figure 18:
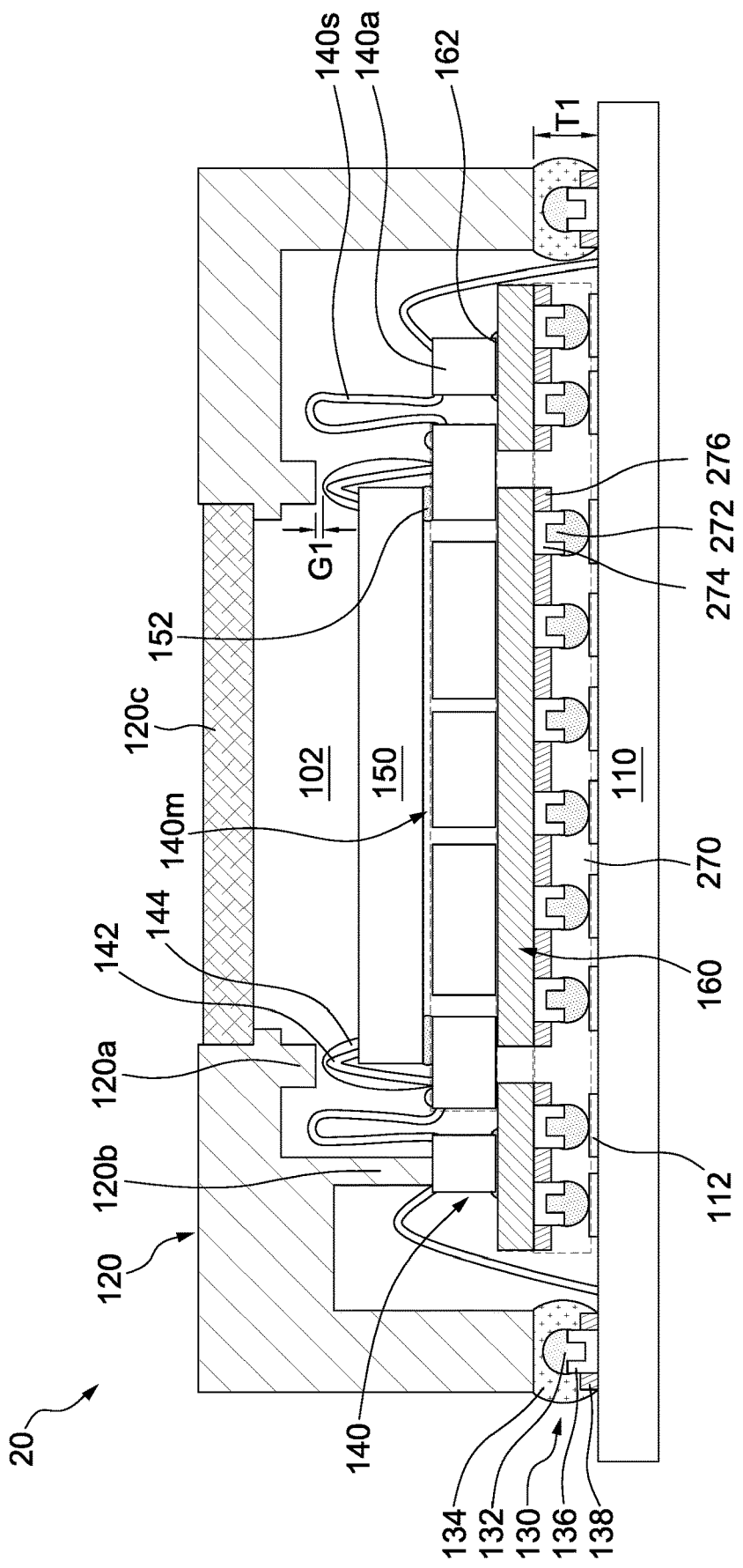

Referring to FIG. 18, a housing structure 120 is mounted to the package substrate 110 through a plurality of composite dampers 130. The respective step is shown as the operation 710 of the method 70 in FIG. 7. The housing structure 120 is formed and is further arranged over and secured to the package substrate 110 to form and seal a cavity 102. In some embodiments, the housing structure 120 covers and surrounds the image sensor structure 150 and the MEMS structure 140. In some embodiments, the housing structure 120 comprises a stopper 120a facing or overlying the interconnect wire 142. Alternatively or additionally, the stopper 120a faces or overlies the epoxy structure 144. Alternatively or additionally, the housing structure 120 comprises a stopper 120b contacting and overlying the MEMS structure 140. The stopper 120a overlying the movable mass 140m may be configured to stop the movable mass 140m from overextending and damaging springs 140s of the movable mass 104m. The housing structure 120 may, for example, be or comprise a polymer, silicon, some other suitable material, or any combination of the foregoing.

In some embodiments, the housing structure 120 is secured to the package substrate 110 by the buffer layer 134. Accordingly, the composite damper 130 including the conductive element 132 and the buffer layer 134 is formed. The composite damper 130 may further include the conductive pad 136 and the dielectric layer 138. In some embodiments, the housing structure 120 is secured to the package substrate 110 by the buffer layer 134 by an adhesive, by fusion bonding, or by some other suitable approach to mounting.

While FIGS. 14 to 18 are described with reference to some embodiments of a method, it will be appreciated that the structures shown in FIGS. 14 to 18 are not limited to the method but rather may stand alone separate of the method. While FIGS. 14 to 18 are described as a series of steps, it will be appreciated that the order of the steps may be altered in other embodiments. While FIGS. 14 to 18 illustrate and describe a specific set of steps, some steps that are illustrated and/or described may be omitted in other embodiments. Further, steps that are not illustrated and/or described may be included in other embodiments. For example, in alternative embodiments, the composite dampers 330 (see FIG. 3) including the conductive element 332 are provided or formed on the housing structure 120 prior to the mounting of the housing structure 120 on the package substrate 110. For another example, in alternative embodiments, the support structure 160 may be mounted on a temporary substrate prior to the mounting of the support structure 160 on the package substrate 110. In such embodiments, the support structure 160 may be mounted on the package substrate 110 after the mounting of the MEMS structure 140 and the image sensor structure 150, and after the forming of the interconnect wires 142 or the epoxy structure 144.

The proposed MEMS packages provide one or more improvements over existing approaches. The proposed MEMS package includes one or more composite dampers. The composite damper may be configured to control a gap between the MEMS structure and the housing structure. Particularly, the composite damper may be configured to control a gap between an interconnect wire (or an epoxy structure) of the MEMS structure and a stopper of the housing structure. Because a fluctuation of the composite damper is significantly less than that of the molding material, variation of the gap may be reduced. Furthermore, with the ability to control the gap inside the MEMS package, sudden shocks to the MEMS package may be dampened. Accordingly, damage may be reduced, and better performance of the MEMS packages may be expected.

In accordance with some embodiments of the present disclosure, a MEMS package is provided. The MEMS package includes a package substrate, a housing structure, an image sensor structure, a MEMS structure and a composite damper. The housing structure overlies the package substrate and comprises a stopper. The image sensor structure and the MEMS structure are between the package substrate and the housing structure. An interconnect wire electrically connects the MEMS structure to the image sensor structure. The composite damper is between the package substrate and the housing structure. The composite damper is configured to control a gap between the interconnect wire and the stopper.

In accordance with some embodiments of the present disclosure, a MEMS package is provided. The MEMS package includes a printed circuit board (PCB), a MEMS structure, a housing structure and a solder ball. The MEMS structure overlies the PCB. The MEMS structure comprises an epoxy structure overlying an upper surface of the MEMS structure. The housing structure overlies the PCB. The housing structure comprises a first stopper facing and spaced apart from a top of the epoxy structure, and a second stopper contacting the upper surface of the MEMS structure. The solder ball is between the PCB and the housing structure. The solder ball is configured to control a gap between the epoxy structure and the stopper.

In accordance with some embodiments of the present disclosure, a method for forming a MEMS package is provided. The method includes the following operations. A support substrate is mounted on a package substrate. A MEMS structure is mounted on the support substrate. An image sensor structure is attached to the MEMS structure. An interconnect wire electrically connecting the image sensor structure to the MEMS structure is formed. A housing structure is mounted on the package substrate through a plurality of composite dampers. The housing structure covers and surrounds the image sensor structure and the MEMS structure, and the housing structure comprises a stopper facing the interconnect wire.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) package, comprising:
    a package substrate;
    a housing structure overlying the package substrate and comprising a stopper;
    an image sensor structure and a MEMS structure between the package substrate and the housing structure, wherein an interconnect wire electrically connects the MEMS structure to the image sensor structure; and
    a composite damper between the package substrate and the housing structure, wherein the composite damper is configured to control a gap between the interconnect wire and the stopper.

2. The MEMS package of claim 1, wherein the composite damper comprises a stack of a conductive element and a buffer layer.

3. The MEMS package of claim 2, wherein the buffer layer is between the conductive element and the package substrate.

4. The MEMS package of claim 2, wherein the buffer layer is between the conductive element and the housing structure.

5. The MEMS package of claim 2, wherein the conductive element comprises a conductive ball, a conductive pillar, a conductive post, or a conductive bump.

6. The MEMS package of claim 2, wherein the buffer layer comprises a glue material.

7. The MEMS package of claim 1, further comprising:
a support substrate between the MEMS structure and the package substrate.

8. The MEMS package of claim 7, further comprising:
an adhesive layer between the MEMS structure and the support substrate.

9. The MEMS package of claim 7, further comprising:
a ball grid array between the MEMS structure and the support substrate.

10. A microelectromechanical systems (MEMS) package, comprising:
a printed circuit board (PCB);
a MEMS structure overlying the PCB, wherein the MEMS structure comprises an epoxy structure overlying an upper surface of the MEMS structure;
a housing structure overlying the PCB, the housing structure comprising a first stopper facing and spaced apart from a top of the epoxy structure, and a second stopper contacting the upper surface of the MEMS structure; and
a solder ball between the PCB and the housing structure, wherein the solder ball is configured to control a gap between the epoxy structure and the stopper.

11. The MEMS package of claim 10, wherein a diameter of the solder ball is in a range between about 0.15 mm and about 0.76 mm.

12. The MEMS package of claim 10, further comprising:
a buffer layer between the solder ball and the housing structure.

13. The MEMS package of claim 12, wherein a total thickness of the solder ball and the buffer layer is in a range between about 330 µm and about 370 µm.

14. The MEMS package of claim 10, wherein the gap is in a range between about 20 µm and about 30 µm.

15. The MEMS package of claim 10, wherein the MEMS structure further comprises an interconnect wire, and the epoxy structure surrounds the interconnect wire.

16. The MEMS package of claim 10, wherein the first stopper and the second stopper comprise different materials.

17. A method for forming a microelectromechanical systems (MEMS) package, comprising:
mounting a support substrate on a package substrate;
mounting a MEMS structure on the support substrate;
attaching an image sensor structure to the MEMS structure;
forming an interconnect wire electrically connecting the image sensor structure to the MEMS structure; and
mounting a housing structure on the package substrate through a plurality of composite dampers, wherein the housing structure covers and surrounds the image sensor structure and the MEMS structure, and the housing structure comprises a stopper facing the interconnect wire.

18. The method of claim 17, wherein the plurality of composite dampers are configured to control a gap between the interconnect wire and the stopper.

19. The method of claim 17, further comprising:
providing or forming the plurality of composite dampers on the package substrate prior to mounting the housing structure to the package substrate.

20. The method of claim 19, wherein the formation of the plurality of composite dampers comprises:
forming an under-bump metallization layer over the package substrate;
forming a conductive material over the under-bump metallization layer; and
performing a reflow to shape the conductive material into a desired shape.

* * * * *